United States Patent
Park

(10) Patent No.: US 12,160,250 B2
(45) Date of Patent: Dec. 3, 2024

(54) DECODING SYSTEM, AND TRANSMITTING/RECEIVING DEVICE THEREOF

(71) Applicant: Samsung Electronics Co., Ltd., Suwon-si (KR)

(72) Inventor: Jeong Woo Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 6 days.

(21) Appl. No.: 17/941,549

(22) Filed: Sep. 9, 2022

(65) Prior Publication Data

US 2023/0095262 A1 Mar. 30, 2023

(30) Foreign Application Priority Data

Sep. 30, 2021 (KR) .......................... 10-2021-0129861
May 4, 2022 (KR) .......................... 10-2022-0055363

(51) Int. Cl.
  *H03M 13/11* (2006.01)
  *H03M 13/29* (2006.01)

(52) U.S. Cl.
  CPC .... *H03M 13/1128* (2013.01); *H03M 13/1125* (2013.01); *H03M 13/1177* (2013.01); *H03M 13/2948* (2013.01)

(58) Field of Classification Search
  None
  See application file for complete search history.

(56) References Cited

U.S. PATENT DOCUMENTS

| | | | |
|---|---|---|---|
| 8,286,048 B1 * | 10/2012 | Chen .................... | H03M 13/114 714/752 |
| 8,719,672 B2 | 5/2014 | Park et al. | |
| 8,826,096 B2 | 9/2014 | Moon et al. | |
| 10,027,441 B2 | 7/2018 | Kim et al. | |
| 10,419,024 B2 | 9/2019 | Xiong et al. | |
| 10,615,822 B1 | 4/2020 | Zhong et al. | |
| 11,005,499 B2 | 5/2021 | Kim et al. | |

(Continued)

FOREIGN PATENT DOCUMENTS

KR 2003-0016720 A 3/2003

*Primary Examiner* — Steve N Nguyen
(74) *Attorney, Agent, or Firm* — Harness, Dickey & Pierce, P.L.C.

(57) ABSTRACT

Provided are a decoding system including a receiving device and a transmitting device. The receiving device comprises a demapper configured to convert received data into a log likelihood ratio (LLR) signal and output the LLR signal, a deparser configured to rearrange the LLR signal by deparsing the LLR signal into orthogonal frequency division multiplex (OFDM) symbols, a codeword loader configured to output the rearranged LLR signal in units of codewords, a decoder controller configured to control a maximum iteration number and the number of decoders to be enabled according to a state of the received data and a low-density parity check (LDPC) decoder configured to repeatedly decode the LLR signal in units of codewords, according to the controlled number of decoders, as many times as the controlled maximum iteration number, wherein the received data comprises real data and a packet extension corresponding to a pre-FEC (forward error correction) padding factor.

15 Claims, 11 Drawing Sheets

(56) References Cited

U.S. PATENT DOCUMENTS

| | | | |
|---|---|---|---|
| 2014/0071956 A1* | 3/2014 | Park | H04W 72/0446 |
| | | | 370/336 |
| 2014/0223255 A1 | 8/2014 | Lu et al. | |
| 2015/0074488 A1* | 3/2015 | Pream | G06F 11/108 |
| | | | 714/759 |
| 2015/0280777 A1* | 10/2015 | Azizi | H04W 52/0216 |
| | | | 370/330 |
| 2018/0041311 A1* | 2/2018 | Werner | H04L 1/1858 |
| 2020/0007265 A1* | 1/2020 | Min | H04L 5/0044 |
| 2021/0360472 A1* | 11/2021 | Cao | H04L 27/2605 |

* cited by examiner

Figure 12

| Number of Active LDPC Decoder | BM | Nss | MCS | Pre-FEC Padding Factor (a) | TPE (µs) | Max CW | Dec En0 | Dec En1 | Max Iter. by OFDM Symbol Duration |
|---|---|---|---|---|---|---|---|---|---|
| 1 | 80 | 1 | 11 | 1 | 0 | 2 | 1 | 0 | >16 |
|   |    |   |    | 2 | 0 | 3 | 1 | 0 | >16 |
|   |    |   |    | 3 | 4 | 4 | 1 | 0 | >16 |
|   |    |   |    | 4 | 8 | 6 | 1 | 0 | >16 |
| 2 | 160 | 2 | 11 | 1 | 4 | 6 | 1 | 0 | >16 |
|   |     |   |    | 2 | 8 | 11 | 1 | 1 | >16 |
|   |     |   |    | 3 | 12 | 16 | 1 | 1 | >16 |
|   |     |   |    | 4 | 16 | 21 | 1 | 1 | >16 |

# DECODING SYSTEM, AND TRANSMITTING/RECEIVING DEVICE THEREOF

CROSS-REFERENCE TO RELATED APPLICATIONS

This application claims priority from Korean Patent Application No. 10-2021-0129861 filed on Sep. 30, 2021 and No. 10-2022-0055363 filed on May 4, 2022 in the Korean Intellectual Property Office, the disclosure of each of which is incorporated herein by reference in its entirety.

BACKGROUND

1. Field of the Disclosure

The present disclosure relates to a decoding system and a transmitting/receiving device thereof.

2. Description of the Related Art

As WiFi standards have been developed from 802.11ac (WiFi 5) to 802.11ax (WiFi 6), the size of a Fast Fourier Transform (FFT) has quadrupled from 256 to 1024 on the basis of a bandwidth of 80 MHz. In addition, constellation points have increased from 246-QAM to 1024-QAM. For example, as a bandwidth of up to 160 MHz and constellation points of up to 1024-QAM are used in WiFi 6, up to 1,201 Mbps per stream is output and thus a higher frequency, higher complexity, and/or higher power consumption would be advantageous to support WiFi 6 in terms of hardware.

A low-density parity check (LDPC) decoder had been selected as an option for error control coding (ECC) of WiFi as of 802.11n and had become a mandatory requirement as of 802.11ac. The LDPC decoder receives a codeword and corrects errors while repeatedly performing parity check pass, until parity check succeeds. Thereafter, with the application of 802.11ax, the number of codewords to be processed per orthogonal frequency division multiplexing (OFDM) symbol has gradually increased, and thus design of an LDPC decoder for reducing or minimizing decoding latency would be advantageous to process all codewords within a symbol duration.

SUMMARY

Aspects of the present disclosure provide a low-density parity check (LDPC) decoder with improved operation performance Aspects of the present disclosure also provide a transmitting/receiving device that satisfies a short interframe space (SIFS) requirement of Wi-Fi standards using a packet extension.

Aspects of the present disclosure provide an LDPC decoder capable of reducing power consumption by adaptively controlling a maximum number of decoding iterations and the number of decoders to be enabled, a decoding system including the same, and a transmitting/receiving device thereof.

Example embodiments of the present disclosure provide a receiving device comprising a demapper configured to convert received data into a log likelihood ratio (LLR) signal and output the LLR signal, a deparser configured to rearrange the LLR signal by deparsing the LLR signal into orthogonal frequency division multiplex (OFDM) symbols, a codeword loader configured to output the rearranged LLR signal in units of codewords, a decoder controller configured to control a maximum iteration number and the number of decoders to be enabled according to a state of the received data and a low-density parity check (LDPC) decoder configured to repeatedly decode the LLR signal in units of codewords, according to the controlled number of decoders, as many times as the controlled maximum iteration number, wherein the received data comprises real data and a packet extension corresponding to a pre-FEC (forward error correction) padding factor.

Other example embodiments of the present disclosure provide transmitting device comprising a transmission processor configured to give a command instructing real data to be transmitted and a sender configured to transmit transmission data to a receiving device in response to the command, the transmission data including the real data and a packet extension, wherein the packet extension is padded to the real data by adjusting padding bits according to a packet type and a pre-FEC (forward error correction) padding factor.

Other example embodiments of the present disclosure provide a decoding system comprising a decoder controller configured to control a maximum number of iterations maximum iteration number and the number of decoders to be enabled according to a state of received data and a low-density parity check (LDPC) decoder including a plurality of LDPC decoders and configured to repeatedly decode a codeword of a received current OFDM symbol according to the controlled number of decoders, until the controlled maximum number of iterations maximum iteration number is reached, wherein the received data comprises real data and a packet extension.

It should be noted that objects of the present disclosure are not limited to the above-described objects, and other objects of the present disclosure will be apparent to those skilled in the art from the following descriptions.

BRIEF DESCRIPTION OF THE DRAWINGS

The above and other aspects and features of the present disclosure will become more apparent by describing in detail example embodiments thereof with reference to the attached drawings, in which:

FIG. 12 is a table for describing calculation of a maximum iteration number, which is performed by the symbol duration iteration number calculation module 212 of FIG. 8, according to some example embodiments.

DETAILED DESCRIPTION OF EXAMPLE EMBODIMENTS

Example embodiments of the present disclosure will be described in detail mainly with respect to an orthogonal frequency division multiplexing (OFDM) symbol-based or an OFDMA-based wireless communication system, and particularly, the IEEE 802.11 standard. It will be understood by those of ordinary skill in the art that the subject matter of the present disclosure is applicable to various types of communication systems having similar technical background and channels (e.g., cellular communication systems such as Long-Term Evolution (LTE)), LTE-Advanced (LTE-A), New Radio (NR), Wireless Broadband (WiBro), and global system for mobile communication (GSM) or short-range communication systems such as Bluetooth and near-field communication (NFC)) with some modifications thereto without departing from the scope of the present disclosure. Hereinafter, memory devices according to some example embodiments of the present disclosure will be described with reference to FIGS. 1 to 12 below.

Figure 1:
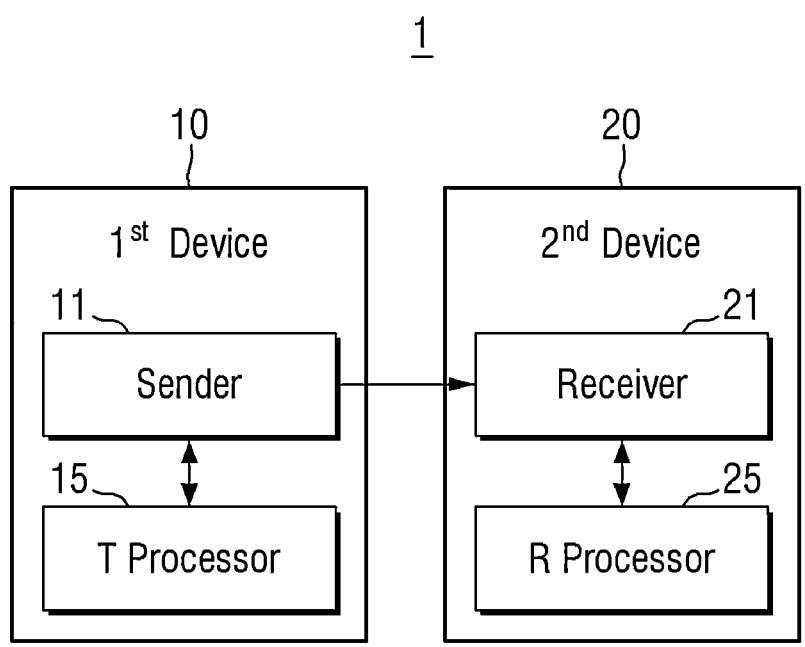
FIG. 1 is a block diagram for describing a transceiving system 1 according to some example embodiments of the present disclosure.

FIG. 1 is a block diagram for describing a transceiving system 1 according to some example embodiments of the present disclosure.

The transceiving system 1 includes a first device 10 that includes a sender 11 and/or a transmission processor 15 to transmit data, and a second device 20 that includes a receiver 21 and a receiving processor 25 to receive data. The transceiving system 1 is a wireless communication system based on a wireless local area network (WLAN) and may be implemented based on standards such as IEEE 802.11ac, IEEE 802.11ax or higher.

The second device 20 may be referred to, for example, as terminal equipment, a mobile station (MS), a mobile terminal (MT), a user terminal (UT), a subscriber station (SS), a wireless device, a handheld device, or the like. The first device 10 and the second device 20 may transmit and receive data through a plurality of antennas thereof. For example, the second device 20 may be a mobile device (e.g., a mobile phone or a smart phone) or a fixed device (e.g., a desktop computer, an access point (AP) device, a media player, a fixed sensor or a television).

The sender 11 may perform signal processing to transmit data. For example, the sender 11 may add additional information such as a header or tail to data or convert digital data into an analog signal. The sender 11 may transmit or receive information necessary for data processing to the transmission processor 15.

The receiver 21 may convert an analog signal transmitted from the sender 11 into a digital signal, and transmit either a signal obtained through conversion or an error-corrected signal to another component included in the second device 20 on the basis of additional information of data. The receiver 21 may inform the receiving processor 25 of a data processing or transmission operation on the basis of the additional information of the data. According to some example embodiments, the receiver 21 of FIG. 1 may be implemented as shown in FIG. 2.

Figure 2:
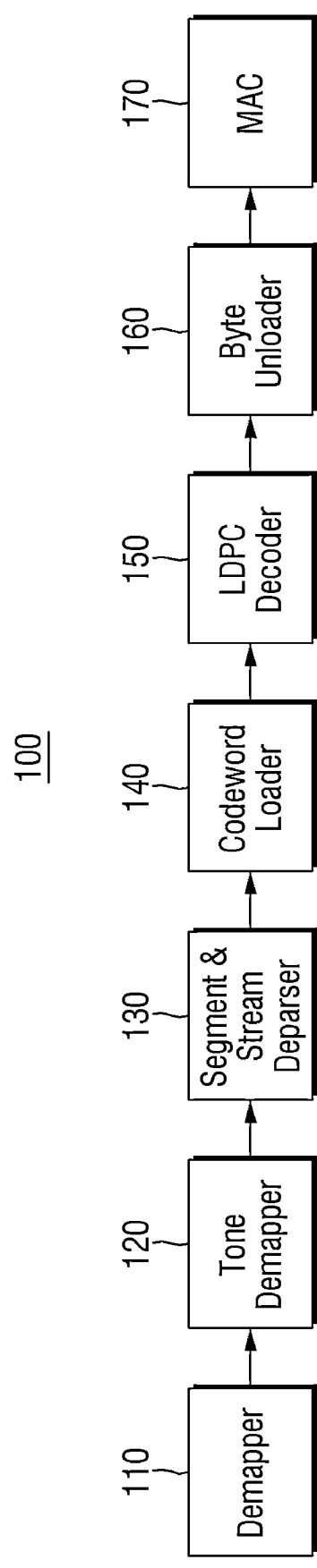
FIG. 2 is a block diagram illustrating a receiver according to some example embodiments.

FIG. 2 is a block diagram illustrating a receiver according to some example embodiments.

Referring to FIG. 2, according to some example embodiments, a receiver 100 may include a demapper 110, a tone demapper 120, a segment and stream deparser 130, a codeword loader 140, an LDPC decoder 150, a byte unloader 160, and/or a media access control (MAC) unit 170. In some example embodiments, the demapper 110, the tone demapper 120, the segment and stream deparser 130, the codeword loader 140, the LDPC decoder 150, the byte unloader 160, and/or the MAC unit 170 may be embodied as hardware, software, firmware or a combination thereof.

Although not shown, the receiver 100 may further include a carrier sensing block that senses an analog signal received before the demapper 110. The demapper 110 converts a demodulation signal of received data into a log likelihood ratio (LLR) signal and outputs the LLR signal. For example, the demapper 110 converts the demodulation signal into the LLR signal by calculating a degree of reliability from a demodulation signal of a subcarrier for the received data. For example, an LLR signal indicating a probability of 0 and 1 for each data subcarrier is output. The tone demapper 120 performs tone demapping on a tone-mapped output LLR signal in a deinterleaving manner.

The segment and stream deparser 130 may include a segment deparser and/or a stream deparser. The segment deparser rearranges data by performing segment deparsing in units of OFDM symbols according to a bandwidth. For example, when a bandwidth is 160 MHz and a bandwidth of an OFDM symbol unit is 80 MHz, ODFM symbol data may be rearranged by segment-deparsing data of 160 MHz into two 80 MHz units. The stream deparser rearranges data by deparsing a stream according to whether an output is multi-in multi-out (MIMO). For example, when two values are set for a spatial stream, the spatial stream may be identified as being received in the form of two streams and the two streams may be merged into at least one stream or divided according to MIMO settings.

The codeword loader 140 may output an LLR signal of data rearranged by the segment and stream deparser 130 by dividing the LLR signal into codewords. Each codeword CW includes source bits and penalty bits of the data. In some example embodiments, a codeword unit may be 640 bits, 1296 bits, or 1944 bits. For example, the sum of source bits and penalty bits may be 1944 bits.

The LDPC decoder 150 performs decoding repeatedly until a maximum iteration number is reached. The decoding performed by the LDPC decoder 150 includes performing error correction while updating a check node message and a variable node message. For example, the variable node message may be started with a raw codeword received from the sender 11. The check node message may be understood to mean a matrix obtained by separating only penalty bits from the raw codeword. The maximum iteration number may be a value set according to one of examples described with respect to FIGS. 3 to 12 below.

The LDPC decoder 150 performs parity check whenever updating is performed. Parity check refers to syndrome check of a codeword matrix C that includes an updated variable message using an H matrix H. That is, syndrome check is performed to determine whether C×H=0 is satisfied, and the LDPC decoder 150 determines that error correction is completed and ends LDPC decoding when a syndrome value is 0 as a result of performing parity check.

The byte unloader 160 changes an LLR signal corresponding to each bit of a codeword output according to a decoding result of the LDPC decoder 150, and determines whether a signed bit of the LLR signal is 0 or 1 according to a hard decision method. That is, 0 is displayed when a most significant bit of the LLR signal increases and 1 is displayed when the most significant bit decreases. In addition, only source bits of a codeword are output in units of bytes to the MAC unit 170.

Figure 3:
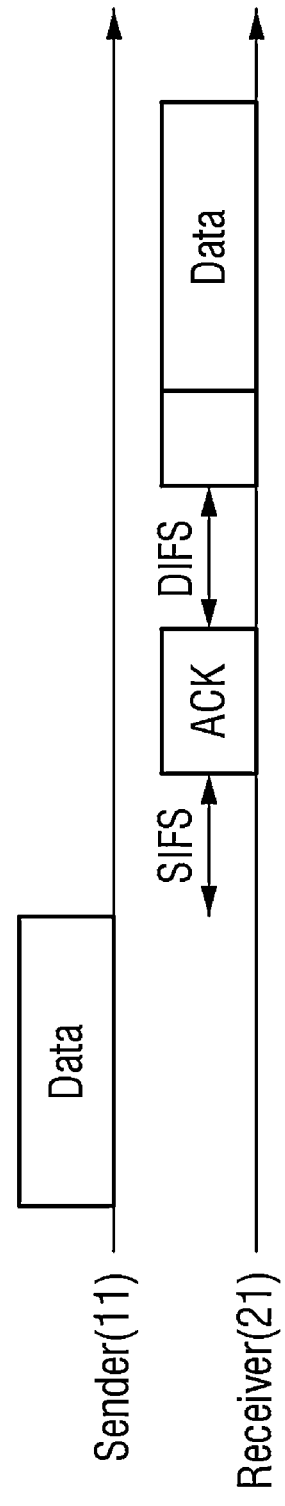
FIG. 3 is a schematic signal diagram of data transmitted and received between a sender and a receiver according to some example embodiments.

FIG. 3 is a schematic signal diagram of data transmitted and received between a sender and a receiver according to some example embodiments.

Referring to FIG. 3, when a sender 11 transmits the data, a receiver 21 transmits an acknowledgement (ACK) message to the sender 11 and thereafter receives data. According to the IEEE 802.11ax standard, a short interface space (SIFS) is a time period from a last point in time when the sender 11 transmitted data to a start point of an ACK message informing the sender 11 that the receiver 21 has safely received the data without an error, and is defined as 16 µs according to the standards.

In the IEEE 802.11ax standard, there may be up to 21 codewords for each OFDM symbol in the case of a MIMO in which the number of spatial streams is 2, a bandwidth is 160 MHz, and a modulation coding scheme (MCS)=11. The MCS is a value related to quadrature amplitude modulation (QAM) and a data rate and ranges from 0 to 11 according to a combination of QAM and the data rate according to the standard. As the MCS increases, the QAM and the data rate increase. For example, at a frequency of 80 MHz, the QAM is Bpsk QAM and the data rate is 1/2 when MCS=0 and the QAM is 1024 QAM and the data rate is 5/6 when MCS=11. When MCS=11 and the number of codewords is 21, error correction is performed the maximum iteration number to decode all the codewords, thereby increasing a latency.

When a latency increases during data transmission and reception between the first device 10 and the second device 20, it is difficult to satisfy the SIFS condition (=16 µs). That is, according to the latency, a point in time when an ACK message is received by the sender 11 from the receiver 21 may exceed 16 µs. To solve this problem, the SIFS condition may be satisfied by decoding received data by arranging a plurality of LDPC decoders 150 in parallel but the complexity of hardware implementation may increase. Therefore, it would be advantageous to have an appropriate number of LDPC decoders capable of decoding all codewords while satisfying the SIFS condition and having higher performance in terms of a packet error rate.

Figure 4:
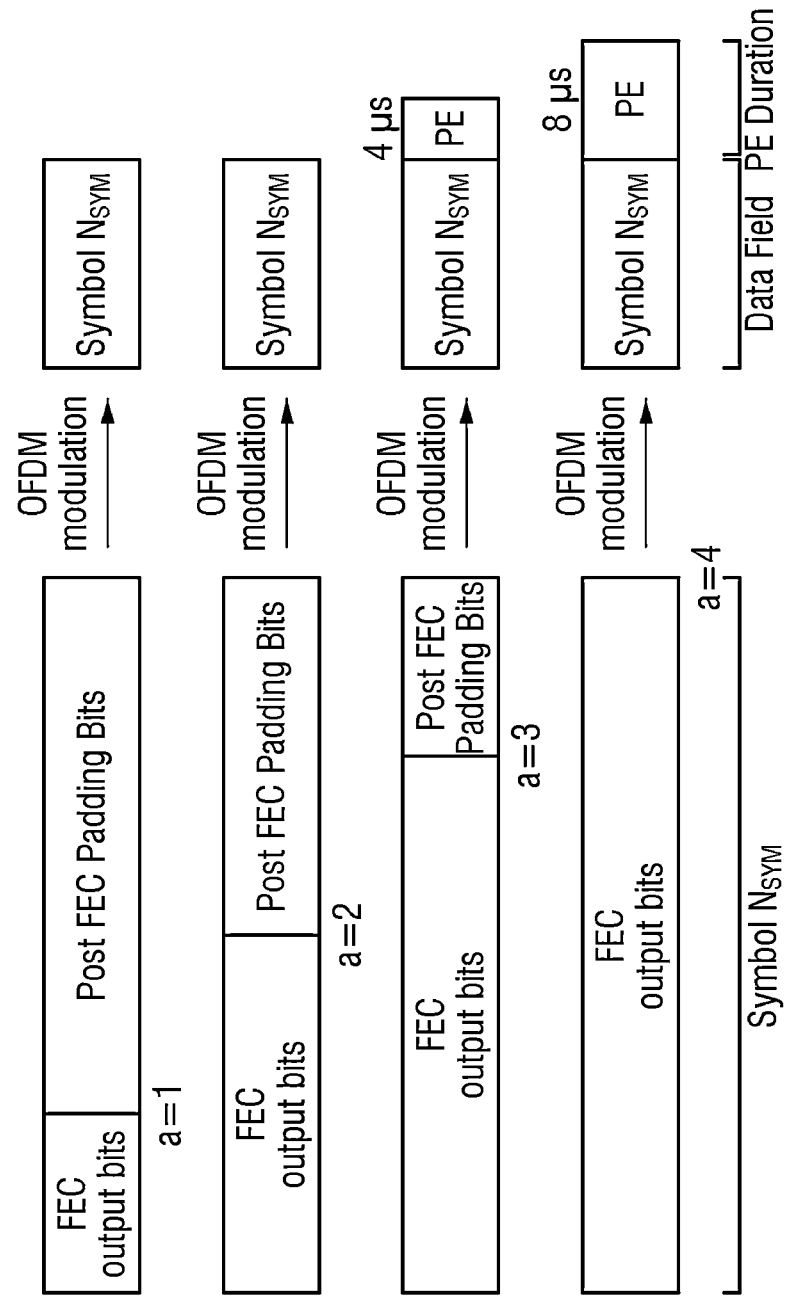
FIGS. 4 and 5 are conceptual diagrams for describing data transmitted from a sender 11 according to some example embodiments of the present disclosure.
Figure 5:
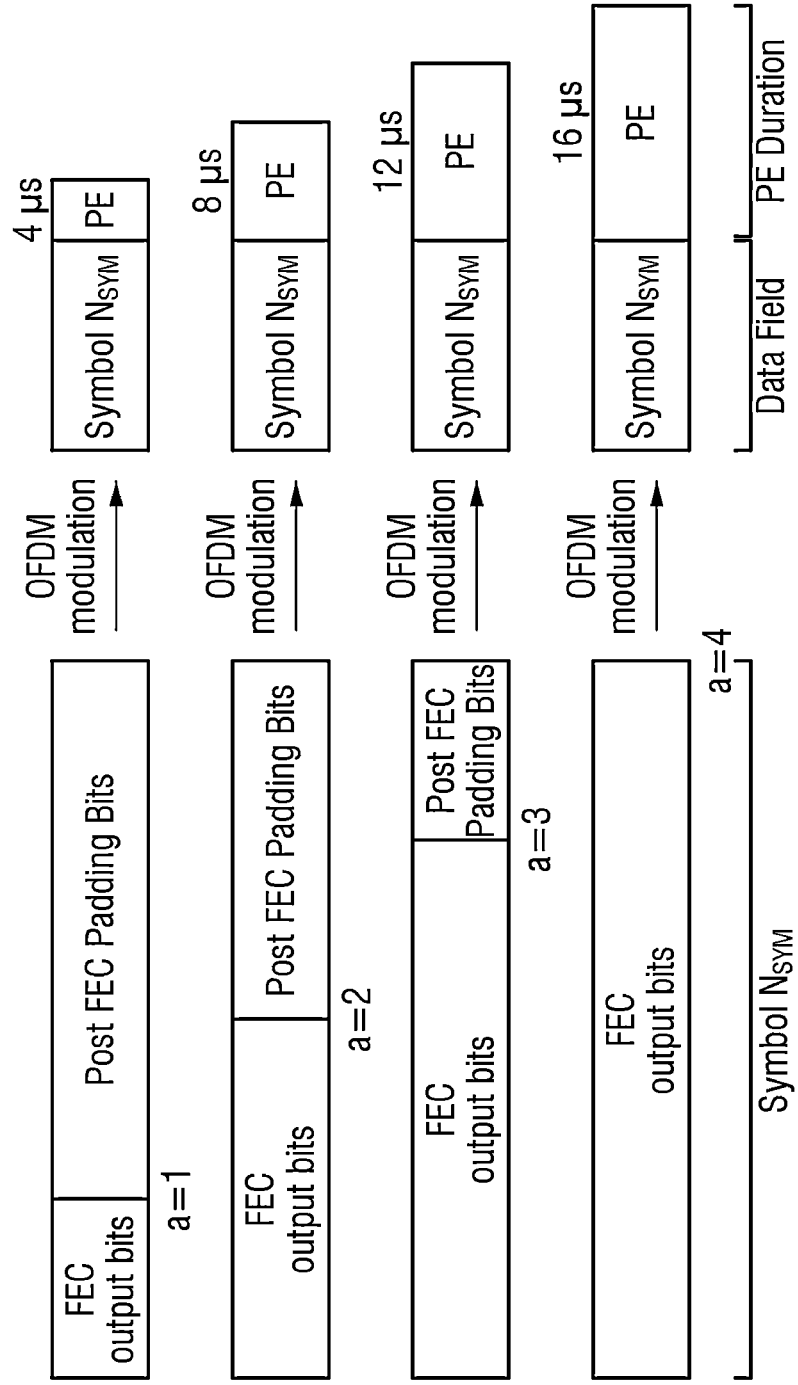

FIGS. 4 and 5 are conceptual diagrams for describing data transmitted from a sender 11 according to some example embodiments of the present disclosure.

According to some example embodiments, data transmitted from the sender 11 includes real data and dummy data. The dummy data may include a packet extension (PE). When the sender 11 transmits real data Symbol $N_{SYM}$ and a packet extension PE, the receiver 100 may transmit an ACK message to the sender 11 on the basis of a last point of the packet extension PE, thereby satisfying the SIFS condition. The packet extension PE will be described in detail below.

The packet extension PE may be implemented in an 8 µs mode or a 16 µs mode according to a maximum duration of a packet extension duration. Example embodiments of an 8 µs mode packet extension will be described with reference to FIG. 4, and example embodiments of a 16 µs mode packet extension will be described with reference to FIG. 5 below.

Referring to FIGS. 4 and 5, in some example embodiments, in the case of the 8 µs mode packet extension, the number of padding bits (post FEC padding bits) may vary according to a pre-FEC padding factor a and thus a duration of the packet extension PE may also change. The pre-FEC padding factor a is an indicator of a ratio of the number of effective subcarriers to the number of subcarriers of OFDM symbol data after OFDM modulation is performed, and may be, for example, a value ranging from 1 to 4.

For example, when the pre-FECT padding factor a=1, the number of effective data subcarriers among subcarriers of OFDM symbol data after OFDM modulation is performed is 1/4, and when the pre-FECT padding factor a=4, all subcarriers of the OFDM symbol data are effective data subcarriers. That is, as the pre-FECT padding factor a increases from 1 to 4, the ratio of the number of effective data subcarriers to the number of the entire subcarriers of the OFDM symbol data increases and thus the number of codewords to be decoded by the LDPC decoder 150 increases. As the number of codewords to be decoded increases, a decoding latency in the receiver 21 also increases.

Thus, the sender 11 adjusts a length of a packet extension on the basis of the pre-FEC padding factor a. Because the pre-FEC padding factor a is based on the number of codewords to be decoded, the length of the packet extension is proportional to the pre-FEC padding factor a.

Referring to FIG. 4, for example, in the packet extension 8 µs mode, a PE duration may be 0 µs when the pre-FEC padding factor a=1, may be 0 µs when the pre-FEC padding factor a=2, may be 4 µs when the pre-FEC padding factor a=3, and may be 8 µs when the pre-FEC padding factor a=4.

Referring to FIG. 5, for example, in the packet extension 16 µs mode, a PE duration may be 4 µs when the pre-FEC padding factor a=1, may be 8 µs when the pre-FEC padding factor a=2, may be 12 µs when the pre-FEC padding factor a=3, and may be 16 µs when the pre-FEC padding factor a=4.

Figure 6:
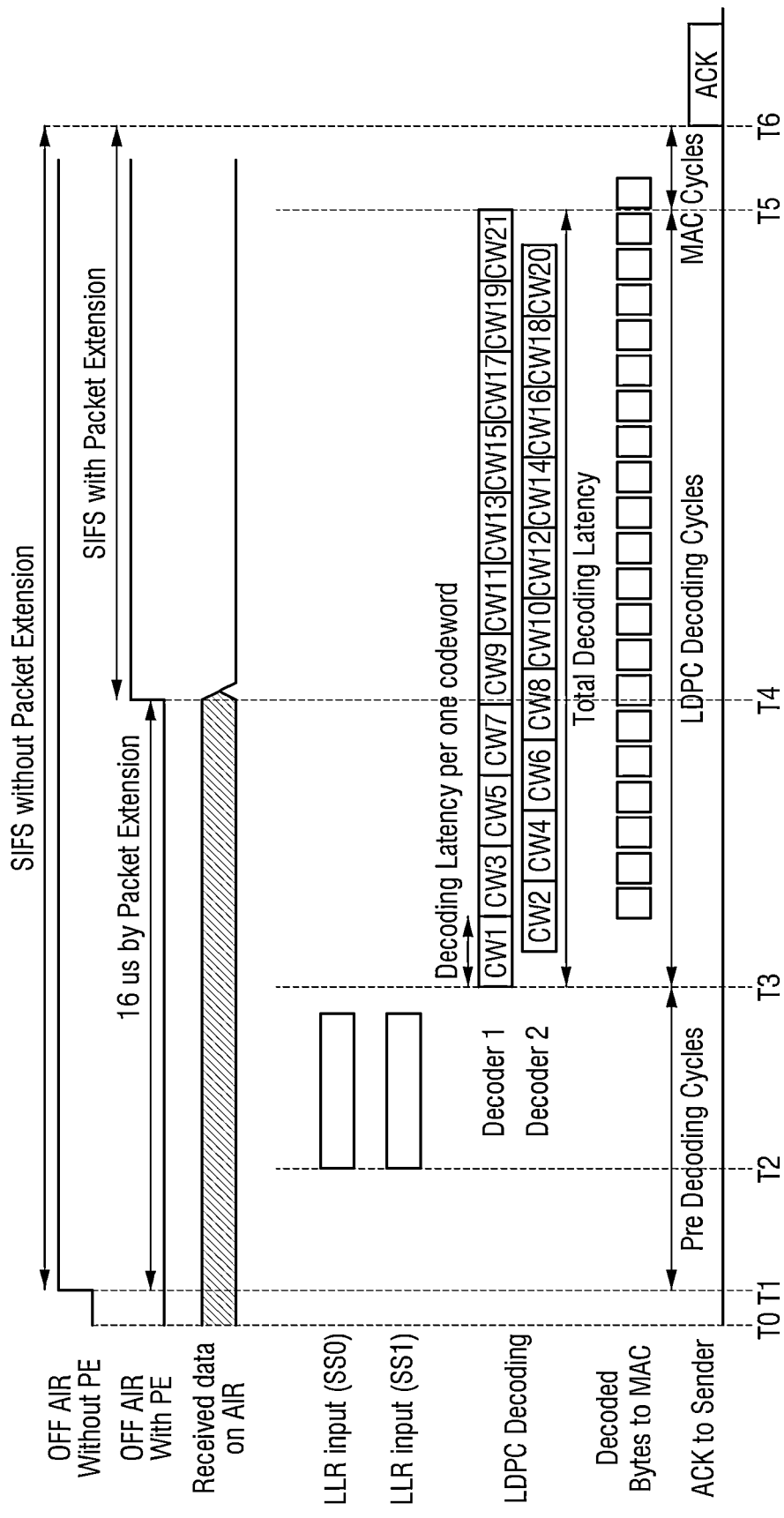
FIG. 6 is a timing diagram of data transmitted and received between a sender and a receiver according to some example embodiments.

FIG. 6 is a timing diagram of data transmitted and received between a sender and a receiver according to some example embodiments.

Referring to FIG. 6, it is assumed, for example, that a pre-FEC padding factor a=4, a bandwidth is 160 MHz, the number of spatial streams (Nss)=2, and MCS=11. In the above example, the maximum number of codewords of real data to be transmitted from the sender 11 is 21.

In the example illustrated in FIG. 6, the receiver 21 performs decoding using two LDPC decoders decoder1 and decoder2, but example embodiments of the present disclosure are not limited thereto.

For example, when the first device 10 transmits data without a packet extension PE, a last packet of transmission data is transmitted at a point in time T1 (OFF AIR without PE). The second device 20 receives the data transmitted from the first device 10 and transmits an ACK message at a point in time T6.

When data without the packet extension PE is received, an SIFS duration ranges from T1 to T6. The transceiving system 1 may meet the SIPS conditions according to the 802.11ax standard when a time difference between T1 and T6 is 16 µs but data may not be likely to be received normally due to latency when the time difference between T1 and T6 exceeds 16 µs.

However, when data with the packet extension PE is transmitted, a point in time when the first device 10 transmits a last packet extends from the point in time T1 to the point in time T4. For example, a packet extension PE duration between T1 and T4 may be 16 µs according to the pre-FEC padding factor a=4.

In the illustrated example, the second device 20 receives transmission data a certain time after the point in time T1 when effective data is last transmitted, performs demapping, tone demapping and segment and stream deparsing on the transmission data, receives a rearranged LLR signal at the point in time T2, and converts resultant transmission data into a codeword.

The first and second LDPC decoders decoder1 and decoder2 included in the receiver 21 perform error correction on a codeword received from the codeword loader 140 at the point in time T2 while updating a check node message and a variable node message. Thereafter, the first LDPC decoder decoder1 may receive and process odd numbered codewords CW1, CW3, CW5, . . . , CW21, and the second LDPC decoder2 may receive and process even numbered codewords CW2, CW4, CW6, CW6, . . . , CW20. Because the two LDPC decoders perform decoding in parallel, the points in time T3 to T5 when decoding is performed correspond to an entire decoding latency. For example, when only one LDPC decoder is used, the entire decoding latency may double.

Only real data of decoded codewords is converted into bytes by the byte unloaders 160 of FIG. 2 and is thereafter output to the MAC unit 170 of FIG. 2 (Decoded bytes to MAC). At a point in time T6 when the converting of the real data by the byte unloader 160 is completed, the receiver 21 transmits an ACK message to the sender 11.

When the sender 11 uses a packet extension (OFF AIR with PE), a point in time when a last data packet is received is delayed from T1 to T4. Because the SIFS duration includes a point in time when a last data packet is transmitted and a point in time when the ACK message is received, e.g., a duration from T4 to T6, the transceiving system 1 may secure sufficient time to perform LDPC decoding in consideration of a decoding latency while meeting the IEEE 801.11ax standard.

Figure 7:
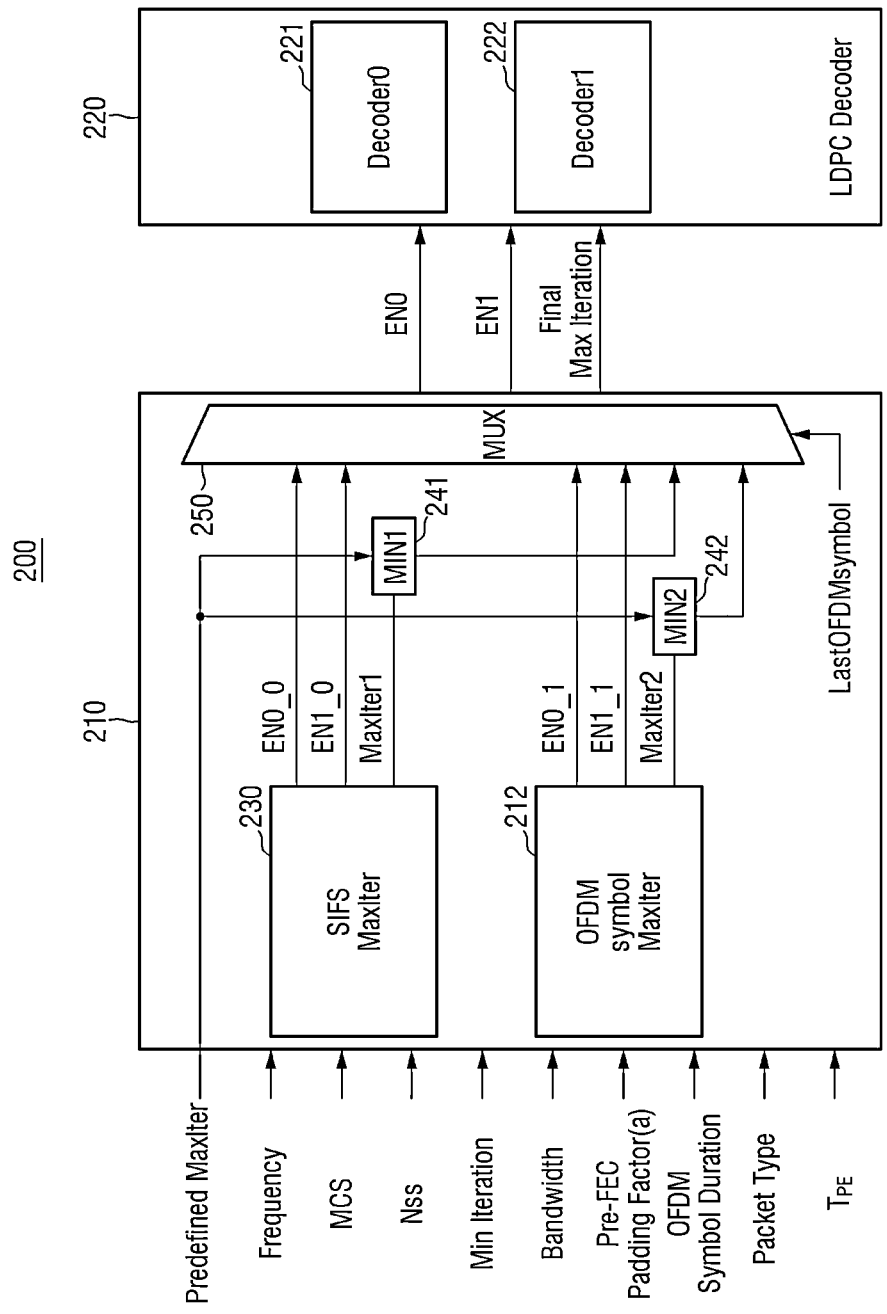
FIG. 7 is a view of a decoding system 200 that includes a decoder controller and a LDPC decoder according to some example embodiments.

FIG. 7 is a view of a decoding system 200 that includes a decoder controller and a LDPC decoder according to some example embodiments.

Referring to FIG. 7, the decoding system 200 includes a decoder controller 210 and/or an LPDC decoder 220. According to some example embodiments, the LDPC decoder 220 may correspond to the LDPC decoder 150 of FIG. 2 and the decoder controller 210 may be a separate module included in the receiver 100 of FIG. 2.

The decoder controller 210 controls a maximum iteration number of the LDPC decoder 220 and the number of decoders to be enabled. In some example embodiments, multiple signals received by the decoder controller 210 may include information about a maximum number of MAC iterations MAC_MaxIter provided from the MAC unit 170 of FIG. 2, a bandwidth, an MCS, the number of spatial streams (Nss), a minimum number of iterations Min Iteration, a pre-FEC padding factor a, an OFDM symbol duration, a frequency, a packet type, and a packet extension duration $T_{PE}$.

In some example embodiments, the LDPC decoder 220 may include a plurality of decoders 221 and 222. The decoder controller 210 may provide the plurality of decoders 221 and 222 with a final maximum iteration number Final Max Iteration calculated based on multiple signals related to an operating state of the receiver 100 of FIG. 2, and enable signals EN0 and EN1 indicating whether the decoders 221 and 222 are to be enabled.

The decoder controller 210 may include an SIFS iteration number calculation module 230, an OFDM symbol duration iteration number calculation module 212, a first minimum value selection module 241, a second minimum value selection module 242, and a multiplexer (MUX) 250.

The SIFS iteration number calculation module 230 may calculate a maximum SIFS iteration number MaxIter1 according to the bandwidth, the MCS, the Nss, the pre-FEC padding factor, the frequency, the packet type, the packet extension duration, a pre-decoding cycle, and/or an MAC cycle.

The OFDM symbol duration iteration number calculation module 212 may calculate a maximum iteration number MaxIter2 per OFDM symbol duration according to the multiple signals, e.g., the bandwidth, the MCS, the Nss, the minimum number of iterations Min Iteration, the pre-FEC padding factor a, the OFDM symbol duration, the frequency, the packet type, and the packet extension duration $T_{PE}$.

The first minimum value selection module 241 compares the maximum number of SIFS iterations MaxIter1 output from the SIFS iteration number calculation module 230 with a predefined, or alternatively, given or desired maximum iteration number Predefined MaxIter defined by the system, and outputs the smaller value to the MUX 250. The second minimum value selection module 242 compares the maximum iteration number MaxIter2 output from the OFDM symbol duration iteration number calculation module 212 with the predefined, or alternatively, given or desired maximum iteration number Predefined MaxIter defined by the system, and outputs the smaller value to the MUX 250. Performance to error (PER) performance may not increase significantly and may saturate even when the number of decoding iterations is continuously increased, and thus, in order to reduce power consumption, the minimum value selection modules 241 and 242 compare the number of iterations output from the SIFS iteration number calculation module 230 or the OFDM symbol duration iteration number calculation module 212 with the predefined, or alternatively, given or desired maximum iteration number and select the smaller value.

In addition, the MUX 250 receives a decoder enable signal (EN0_0, EN1_0) from the SIPS iteration number calculation module 230 and a decoder enable signal (EN0_1, EN1_1) from the OFDM symbol duration iteration number calculation module 212.

An output of the MUX 250 may depend on whether an OFDM symbol that is currently being decoded is a last OFDM symbol or not. For example, when a normal OFDM symbol is to be decoded, e.g., when a last OFDM symbol sign signal LastOFDMsymbol is disabled, the MUX 250 outputs an output of the second minimum value selection module 242 as a final maximum iteration number, and the decoder enable signal (EN0_1, EN1_1) is output from the SIFS iteration number calculation module 212 to the LDPC decoder 220. For example, when the last OFDM symbol signal LastOFDMsymbol is enabled, the MUX 250 outputs an output of the first minimum value selection module 441 as the final maximum iteration number, and the decoder enable signal (EN0_0, EN1_0) is output from the SIFS iteration number calculation module 230 to the LDPC decoder 220.

The SIFS iteration number calculation module 230 and the OFDM symbol duration iteration number calculation module 212 will be described in more detail with reference to FIGS. 8 and 9 below.

Figure 8:
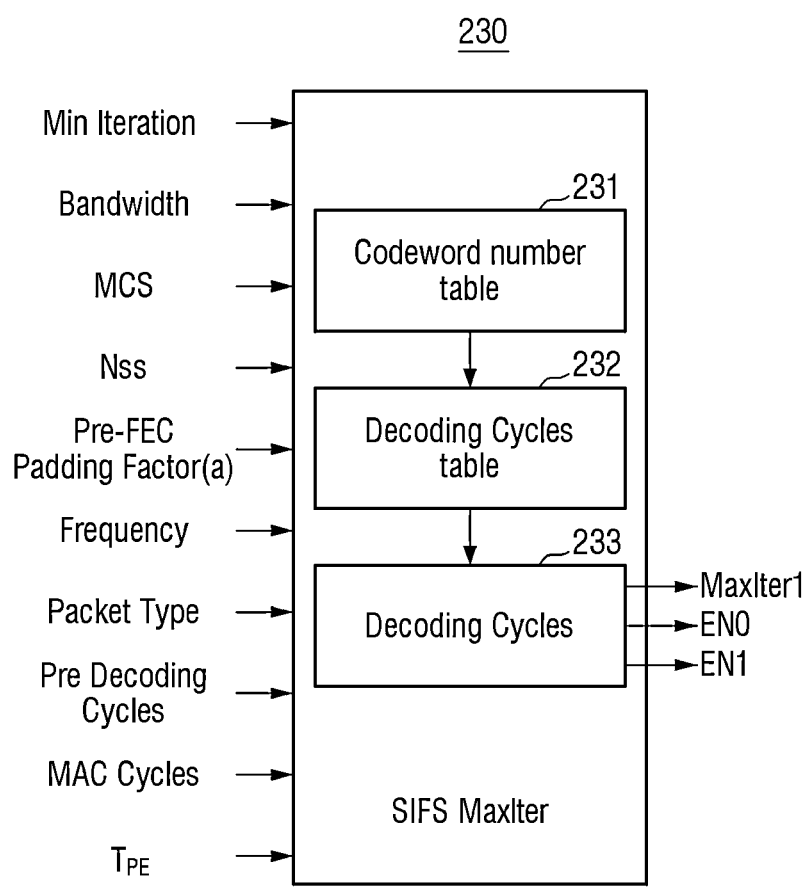
FIG. 8 is a diagram for describing an SIFS iteration number calculation module 230 according to some example embodiments.

FIG. 8 is a diagram for describing an SIFS iteration number calculation module 230 according to some example embodiments.

Referring to FIG. 8, according to some example embodiments, the SIFS iteration number calculation module 230 may calculate a maximum number of SIFS iterations Max-Iter1 according to multiple signals, e.g., a bandwidth, an MCS, an Nss, a pre-FEC padding factor a, a frequency, a packet type, a pre-decoding cycle, an MAC cycle, and a packet extension duration $T_{PE}$. The SIFS iteration number calculation module 230 calculates the maximum number of SIFS iterations MaxIter1 and a decoder enable signal (EN0_0, EN1_0) on the basis of a last OFDM symbol among OFDM symbols received by the receiver 100 of FIG. 2.

According to some example embodiments, the SIFS iteration number calculation module 230 may include a codeword number table 231, a decoding cycle table 232, and/or an SIFS decoding cycle module 233. The codeword number table 231 may output a maximum number of codewords related to, or corresponding to, the last OFDM symbol on the basis of a packet type, a bandwidth, an MCS, an Nss, and a pre-FEC padding factor a.

The decoding cycle table 232 stores, in the form of a table, information to which the number of decoding cycles per iteration stored in the codeword number table 231 is mapped. The decoding cycle table 232 may output a total number of decoding cycles stored in the table according to a maximum number of codewords calculated by the codeword number table 231 using Equation 1 below and the number of enabled decoders 220.

$$\text{Total Decoding cycles} = \frac{\text{Max Codeword Number} \times \text{Decoding cycle number per One iteration} \times \text{Iteration Number}}{\text{Number of enabled } LDPC \text{ Decoder}} \quad \langle\text{Equation 1}\rangle$$

The SIFS decoding cycle module 233 calculates a maximum number of SIFS iterations by using the "iteration number" in Equation 1 above as a variable.

The SIFS decoding cycle module 233 calculates the number of LDPC decoding cycles by Equation 2 below to calculate the maximum number of SIFS iterations MaxIter1.

Pre-Decoding cycles+LDPC Decoding cycles+MAC cycles−$T_{PE}$<16 μs×Frequency ⟨Equation 2⟩

In Equation 2, "LDPC decoding cycles" denotes a total number of decoding cycles calculated by Equation 1. In Equation 2, "16 μs" is an SIFS condition according to a standard such as 802.11ax or earlier, and "pre-decoding cycle" denotes the number of cycles from a point in time T1 when a last packet of real data is transmitted from the sender 11 other than a dummy packet to a point in time T3 when the receiver 100 inputs a codeword to the LDPC decoder 150 for a first time, when described with reference to FIG. 6.

"MAC cycles" denotes the number of cycles (T5 to T6 in FIG. 6) until a point in time when an ACK message is generated after a value decoded by the MAC unit 170 is received, a cyclic redundancy check (CRC) operation is performed, and whether the CRC operation passes is determined. The MAC cycles may be a predefined, or alternatively, given or desired value and be handled as a constant.

A packet extension duration $T_{PE}$ may be a value preset according to the specifications of the receiver 21. When these values are substituted into Equation 2, Equation 2 is converted into Equation 3 of LDPC decoding cycles.

LDPC Decoding cycles<16 μs×Frequency−Pre-Decoding cycles−MAC cycles+$T_{PE}$ ⟨Equation 3⟩

Referring to FIG. 6, "LDPC Decoding cycles" denotes a value related to the number of enabled decoders #Decoder, a maximum number of codewords, and the number of decoding cycles per iteration #Decoding Cycle per One iteration and thus may be expressed by Equation 4 below.

$$\text{Iteration Number} < \frac{\begin{array}{c}\# \text{ Decoder} \times \{16\mu s \times \\ \text{Frequency} - \text{Pre-Decoding} \\ \text{cycles} - MAC \text{ cycles} + T_{PE}\}\end{array}}{\begin{array}{c}\text{Max Codeword Number} \times \\ \# \text{ Decoding Cycle per} \\ \text{One iteration}\end{array}} \quad \langle\text{Equation 4}\rangle$$

According to Equation 4, pre-decoding cycles and MAC cycles may be subtracted from an SIFS duration according to a frequency and the 802.11ax standard, a packet extension duration may be added to the difference to calculate the number of 100% decoding cycles ({16 μs×Frequency−Pre-Decoding cycles−MAC cycles+$T_{PE}$} in Equation 4), the number of 100% decoding cycles may be multiplied by the number of enabled decoders #Decoder, the product may be divided by the sum of a maximum number of codewords and the number of decoding cycles per iteration, and an integer smaller than the quotient may be determined as a maximum number of SIFS iterations.

However, according to some example embodiments, the SIFS decoding cycle module 233 may adjust the number of enabled decoders #Decoder to set the maximum number of SIFS iterations to be greater than a minimum number of iterations. Even when the number of iterations of a decoder is continuously increased, PER(Packet Error Rate) performance may not increase significantly and may saturate. Thus a predefined, or alternatively, given or desired value may be used as the minimum number of iterations to reduce power consumption of the system. That is, the number of iterations that is less than the right side of Equation 4 may be calculated, and a maximum value among numbers of iterations (Min iteration≤Iteration Number) that are integers greater than or equal to a minimum number of iterations input to the decoder controller 210 may be calculated and output as the maximum iteration number.

According to some example embodiments, the SIFS decoding cycle module 233 may determine the number of decoders to be enabled. For example, in order to determine the number of LDPC decoders 220 to be enabled, the number of decoders is set to be 1 (#Decoder=1), and Equation 4 is calculated to determine whether a condition of the number of iterations (Min iteration≤Iteration Number) that a result value be an integer greater than or equal to the minimum number of iterations is satisfied. This should be understood to mean that when the above condition (Min iteration≤Iteration Number) is satisfied, decoding can be performed the number of iterations for achieving satisfactory performance even when only one LDPC decoder is enabled. However, when the above condition (Min iteration≤Iteration Number) is not satisfied, the number of decoders may be set to 2 (#Decoder=2), and Equation 4 may be calculated to repeatedly determine whether the condition is satisfied and determine the number of LDPC decoders to be enabled.

For convenience of description, it is assumed that the number of LDPC decoders is two, but the scope of the present disclosure is not limited thereto and the number of decoders may be more than two. The number of enabled decoders may be determined by repeatedly checking whether the number of decoders #Decoder satisfies Equation 4.

Figure 9:
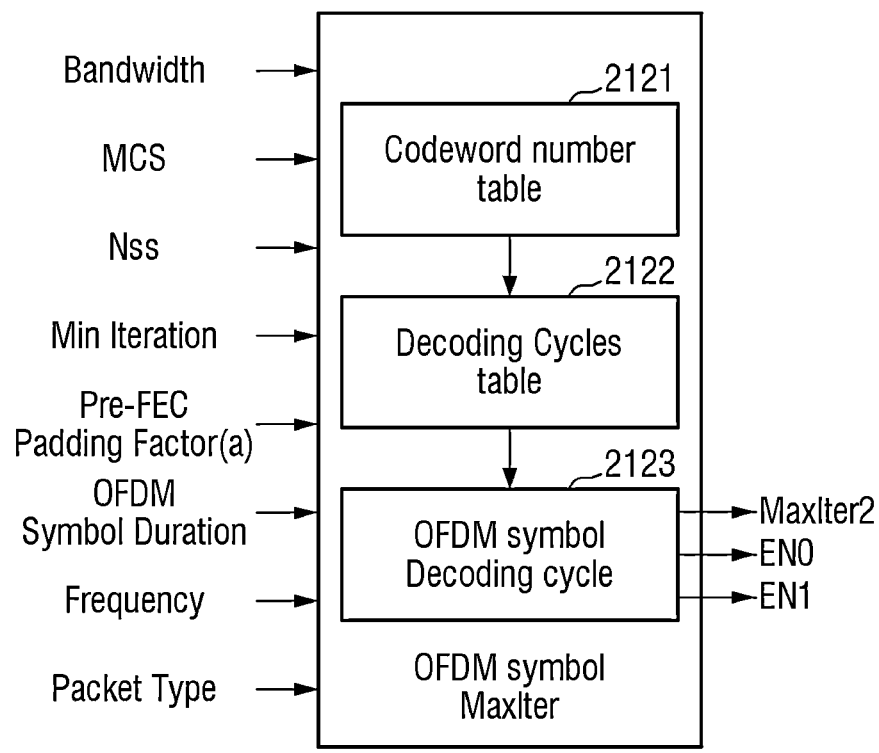
FIG. 9 is a diagram for describing a symbol duration iteration number calculation module 212 according to some example embodiments.

FIG. 9 is a diagram for describing a symbol duration iteration number calculation module 212 according to some example embodiments.

Referring to FIGS. 7 and 9, the symbol duration iteration number calculation module 212 may calculate a maximum iteration number MaxIter2 per symbol duration according to multiple signals, e.g., a bandwidth, an MCS, an Nss, a minimum number of iterations, a pre-FEC padding factor a, an OFDM symbol duration, a frequency, and/or a packet type. The symbol duration iteration number calculation module 212 may calculate the maximum iteration number using a normal OFDM symbol other than a last OFDM symbol among OFDM symbols received by the receiver 100.

In some example embodiments, the OFDM symbol duration may be 13.6 µs, 14.4 µs, or 16 µs.

According to some example embodiments, the symbol duration iteration number calculation module 212 may include a codeword number table 2121, a decoding cycle table 2122, and/or a symbol decoding cycle module 2123. The codeword number table 2121 may output a maximum number of codewords of the normal OFDM symbol on the basis of packet type, a bandwidth, an MCS, an Nss, and a pre-FEC padding factor.

The decoding cycle table 2122 stores, in the form of a table, information to which the number of decoding cycles per iteration stored in the codeword number table 2121 is mapped. The decoding cycle table 2122 may output a total number of decoding cycles from the stored table according to a maximum number of codewords calculated by the codeword number table 2121 using the equation 2 above and the number of enabled decoders 220.

Unlike the SIFS decoding cycle module 233 described above, the symbol decoding cycle module 2123 calculates a maximum iteration number for reducing or preventing a time required to decode all codewords generated from a current OFDM symbol from exceeding an OFDM symbol duration in relation to a previous last OFDM symbol duration. This is because decoding of the current OFDM symbol should be completed before a codeword of a next OFDM symbol is input to reduce or prevent data from being overwritten. Therefore, the number of LDPC decoding cycles should satisfy a condition of Equation 5 below.

$$\text{LDPC Decoding cycles} < \text{OFDM Symbol Duration} \times \text{Frequency} \quad \text{<Equation 5>}$$

Referring to FIG. 6, "LDPC decoding cycles" denotes a value related to the number of enabled decoders #Decoder, a maximum number of codewords, and the number of decoding cycles per iteration #Decoding Cycle per One iteration and thus may be expressed by Equation 6 below when Equation 5 is applied thereto.

$$\text{Min Iteration} \leq \text{Iteration number} < \frac{\text{\# Decoder} \times \{OFDM \text{ Symbol Duration} \times \text{Frequency}\}}{\text{Max Codeword Number} \times \text{\# Decoding Cycle per One iteration}} \quad \text{<Equation 6>}$$

The symbol decoding cycle module 2123 may multiply the number of decoding cycles matching an OFDM symbol duration and a frequency by the number of enabled decoders, divide the product by the sum of the maximum number of codewords and the number of decoding cycles per iteration, and set a value smaller than the quotient as a maximum iteration number MaxIter2 per symbol duration.

However, according to some example embodiments, the symbol decoding cycle module 2123 may adjust the number of enabled decoders #Decoder to set the maximum iteration number MaxIter2 per symbol duration to be greater than a minimum number of iterations. Even when the number of iterations of a decoder is continuously increased, PER performance may not increase significantly and may saturate and thus a predefined, or alternatively, given or desired value may be used as the minimum number of iterations to reduce power consumption of the system. That is, the symbol decoding cycle module 2123 may calculate the number of iterations smaller than the right side of Equation 6, and calculate and output a maximum iteration number among the numbers of iterations (Min iteration≤Iteration Number) that are integers greater than or equal to a minimum number of iterations input to the symbol duration iteration number calculation module 212.

In some example embodiments, the symbol decoding cycle module 2123 may be in arithmetic circuits based on Equation 6 and thus may output a maximum iteration number when an input condition is input thereto, or in some example embodiments, the number of iterations that may be calculated according to each condition may be implemented in the form of a predefined, or alternatively, given or desired table to output a maximum iteration number corresponding to an input condition.

According to some example embodiments, the symbol decoding cycle module 2123 may determine the number of decoders to be enabled and output decoder enable signals EN0 and EN1. For example, in order to determine the number of LDPC decoders 220 to be enabled, the number of decoders may be set to 1 (#Decoder=1) and Equation 6 may be calculated to determine whether a condition of a minimum number of iterations (Min iteration≤Iteration Number) is satisfied. This should be understood to mean that when the above condition of the minimum number of iterations (Min iteration≤Iteration Number) is satisfied, decoding can be performed the number of iterations for achieving satisfactory performance even when only one LDPC decoder is enabled. However, when the above condition of the minimum number of iterations (Min iteration≤Iteration Number) is not satisfied, the number of decoders may be set to 2 (#Decoder=2), and Equation 6 may be calculated to repeatedly determine whether the condition is satisfied and determine the number of LDPC decoders to be enabled.

For convenience of description, it is assumed that the number of LDPC decoders 220 is two in the examples illustrated herein, but when the number of LDPC decoders is greater than or equal to 2 (e.g., a natural number of k, k≥2), the number of decoders to be enabled may vary according to whether the condition of the minimum number of iterations according to Equation 6 is satisfied when #Decoder=1 to k.

Figure 10:
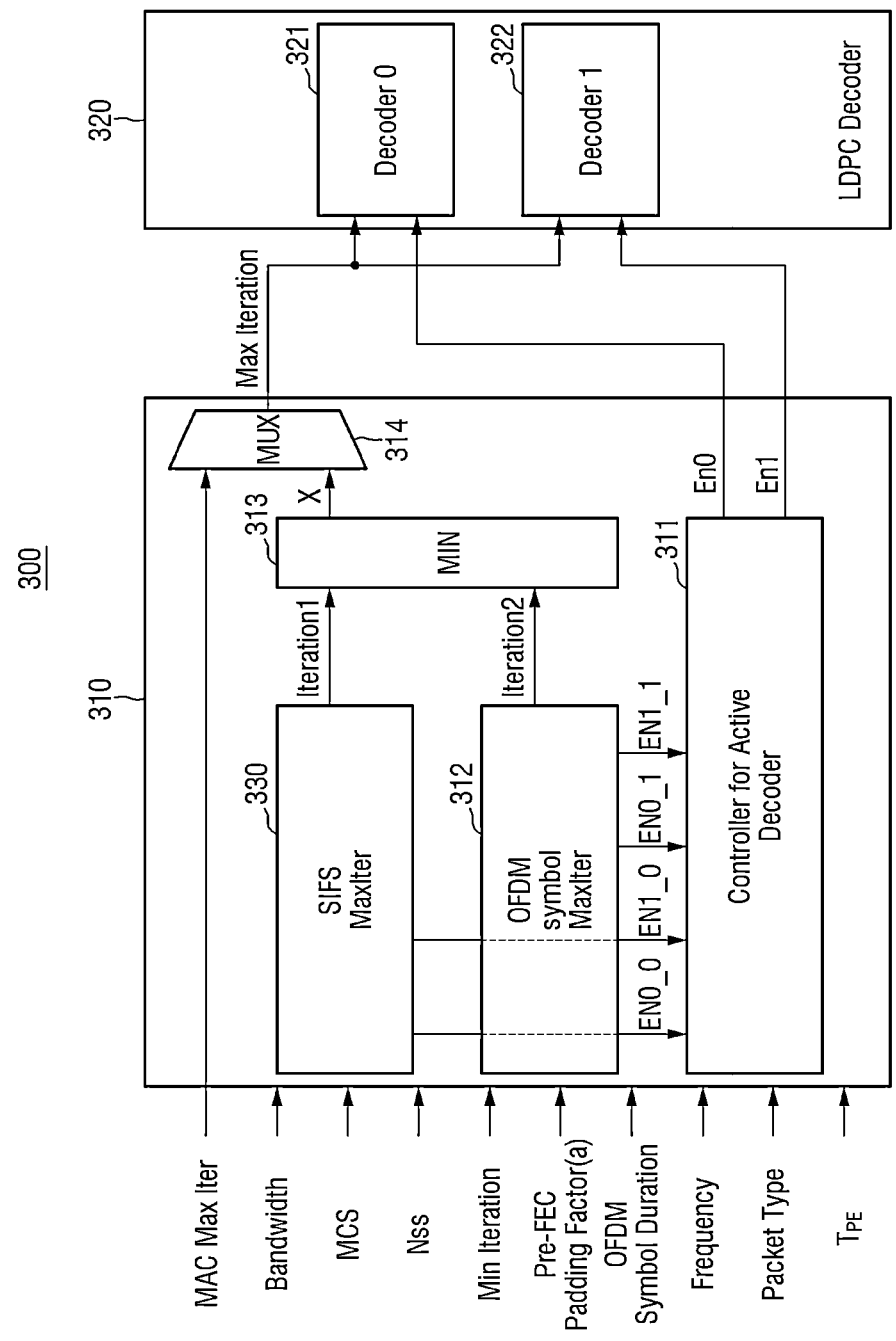
FIG. 10 is a view of a decoding system 300 that includes a decoder controller and an LDPC decoder according to some example embodiments.

FIG. 10 is a view of a decoding system 300 that includes a decoder controller and an LDPC decoder according to some example embodiments.

Referring to FIG. 10, the decoding system 300 includes a decoder controller 310 and/or an LPDC decoder 320.

The decoder controller 310 controls a maximum iteration number of the LDPC decoder 320 and the number of decoders to be enabled. In some example embodiments, multiple signals received by the decoder controller 310 may include information about a maximum number of MAC iterations MAC_MaxIter provided from the MAC unit 170 of FIG. 2, a bandwidth, an MCS, an Nss, a minimum number of iterations Min Iteration, a pre-FEC padding factor a, an OFDM symbol duration, a frequency, a packet type, and a packet extension duration $T_{PE}$. In some example embodiments, the LDPC decoder 320 may include a plurality of decoders 321 and 322. The decoder controller 310 may provide the plurality of decoders 321 and 322 with a second maximum iteration number Max Iteration calculated based on multiple signals related to an operating state of the receiver 100 of FIG. 2 and enable signals EN0 and EN1 indicating whether the decoders 321 and 322 are to be enabled.

The decoder controller 310 may include an active decoder controller 311, an OFDM symbol duration iteration number calculation module 312, a minimum value selection module (MIN) 313, a MUX 314, and an SIFS iteration number calculation module 330.

The minimum value selection module (MIN) 313 may select the smaller value between an output of the OFDM symbol duration iteration number calculation module 312 and an output of the SIFS iteration number calculation module 330 according to Equation 7 below.

$$\text{MIN Iteration}_{213} = \text{MIN}(\text{MaxIter1}, \text{MaxIter2}) \qquad <\text{Equation 7}>$$

The MUX 314 may select one of a maximum number of MAC iterations MAC_MaxIter calculated by the MAC unit 170 and a maximum iteration number X calculated by the minimum value selection module (MIN) 313 according to whether a current OFDM symbol is a last OFDM symbol, and output the selected value to the LDPC decoder 220. In some example embodiments, the maximum iteration number MAC_MaxIter calculated by the MAC unit 170 may be a value defined by a system.

The active decoder controller 311 receives decoder enable signals EN0_1 and EN1_1 according to a result of an operation of the symbol duration iteration number calculation module 312 and decoder enable signals EN0_0 and EN1_0 according to a result of an operation of the SIFS iteration number calculation module 330, and outputs decoder enable signals EN0 and EN1 according to whether a current OFDM symbol is a last OFDM symbol. For example, when the current OFDM symbol is not a last OFDM symbol, the active decoder controller 311 may output enable signals of the decoders 321 and 322 according to the result of the operation of the symbol duration iteration number calculation module 312 to the LDPC decoder 320. For example, when the current OFDM symbol is a last OFDM symbol, the active decoder controller 311 may output enable signals of the decoder 321 and 322 according to the result of the operation of the SIFS iteration number calculation module 330.

Figure 11:
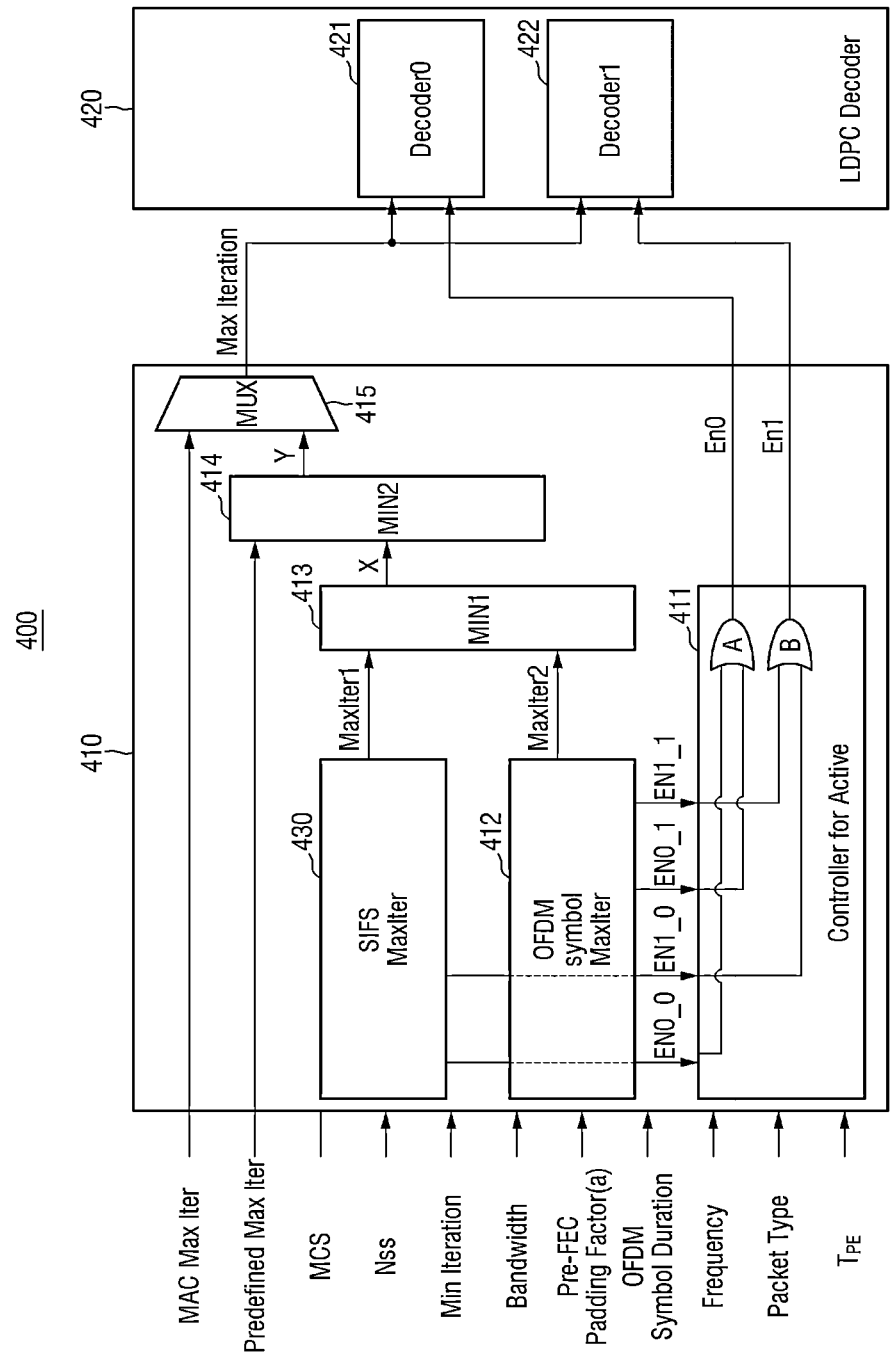
FIG. 11 is a view of a decoding system 400 that includes a decoder controller and an LDPC decoder according to some example embodiments.

FIG. 11 is a view of a decoding system 400 that includes a decoder controller and an LDPC decoder according to some example embodiments. For convenience of description, description of components that are the same as those of FIG. 10 is omitted.

Referring to FIG. 11, a decoder controller 410 may provide a plurality of decoders 421 and 422 with a second maximum iteration number Max Iteration calculated based on multiple signals related to an operating state of the receiver 100 of FIG. 2 and enable signals EN0 and EN1 indicating whether the decoders 421 and 422 are to be enabled.

The decoder controller 410 may include an active decoder controller 411, an OFDM symbol duration iteration number calculation module 412, a first minimum value selection module (MIN1) 413, a second minimum value selection module (MIN2) 414, a MUX 415, and/or an SIFS iteration number calculation module 430.

The active decoder controller 411 may selectively output an enable signal (EN0_0, EN1_1) output from the SIFS iteration number calculation module 430 and a decoder enable signal (EN0_1, EN1_1) output from the OFDM symbol duration iteration number calculation module 412. For example, the first LDPC decoder 421 and the second LDPC decoder 422 may be enabled and operate according to decoder enable signals of the SIFS iteration number calculation module 430 or the OFDM symbol duration iteration number calculation module 412.

According to some example embodiments, the active decoder controller 411 may include OR circuits A and B. For example, the OR circuit A may perform an OR operation on the first decoder enable signal EN0_0 output from the SIFS iteration number calculation module 430 and the first decoder enable signal EN0_1 output from the OFDM symbol duration iteration number calculation module 412, and output a result of the OR operation. For example, the OR circuit B may perform the OR operation on the second decoder enable signal EN1_0 output from the SIFS iteration number calculation module 430 and the second decoder enable signal EN1_1 output from the OFDM symbol duration iteration number calculation module 412, and output a result of the OR operation.

The first minimum value selection module (MIN1) 413 selects and outputs the smaller value between a maximum iteration number Iteration1 output from the SIFS iteration number calculation module 430 and a maximum iteration number Iteration2 output from the OFDM symbol duration iteration number calculation module 412. The second minimum value selection module (MIN2) 414 outputs the smaller value between a maximum iteration number Max Iteration predefined, or alternatively, given or desired by the system and an output of the first minimum value selection module (MIN1) 413. Even if the number of iterations is continuously increased, PER performance may not significantly increase and may saturate and thus the smaller value is selected on the basis of a comparison with the number of iterations output from the SIFS iteration number calculation module 430 or the OFDM symbol duration iteration number calculation module 412 to reduce power consumption.

The MUX 415 selects and outputs one of a maximum iteration number MAC_MaxIter set by the MAC unit 170 and an output of the second minimum value selection module (MIN2) 414. The maximum iteration number set by the MAC unit 170 may be a register set value of the MAC unit 170.

FIG. 12 is a table for describing calculation of a maximum iteration number, which is performed by the symbol duration iteration number calculation module 212 of FIG. 8, according to some example embodiments. For convenience of description, it is assumed that operation is performed at 160 MHz, Nss=2, and MCS=11 according to the 802.11ax standard, but the scope of the present disclosure is not limited to the values shown in the table. For example, an appropriate number of LDPC decoders may be implemented in consideration of hardware complexity, a bandwidth may be set differently, an Nss may be set to a different value greater than or equal to 1, and an MCS may be set to a value between 0 and 11.

For example, when one of two LDPC decoders is enabled (Number of Active LDPC Decoder=1), a bandwidth is 80 MHz, Nss=1, and MCS=11, a pre-FEC padding factor a is 1, 2, 3 or 4 and a packet extension duration $T_{PE}$ is 0 µs, 0 µs, 4 µs, or 8 µs as described above with reference to FIG. 4, and therefore a maximum number of codewords is 2, 3, 4 or 6. An LDPC decoding cycle according to a calculated maximum number of codewords may satisfy the SIFS condition (16 μs) and thus only one LDPC decoder (e.g., a decoder 0, DecEN0) may be enabled and operated.

For example, when two LDPC decoders are both enabled (Number of Active LDPC Decoder=2), a bandwidth is 160 MHz, Nss=2, and MCS=11, a pre-FEC padding factor a is 1, 2, 3 or 4 and a packet extension duration $T_{PE}$ is 4 μs, 8 μs, 12 μs, or 16 μs as described above with reference to FIG. 5, and therefore a maximum number of codewords is 6, 11, 16 or 21. When only one LDPC decoder is enabled and Equation 5 is calculated to determine whether a condition of the number of iterations (Min iteration≤Iteration Number) that is an integer greater than or equal to a minimum number of iterations Min Iteration is satisfied, the condition may be satisfied when a pre-FEC padding factor a=1 and a maximum number of codewords Max CW=6 but may not be satisfied when the pre-FEC padding factor a=2, 3 or 4. That is, it may be difficult to complete decoding of all codewords with only one LDPC decoder under the SIFS condition (16 μs).

Accordingly, when the pre-FEC padding factor a=2, 3 or 4, the SIFS condition may be satisfied by performing decoding by enabling two LDPC decoders (DecEN0=1, DecEN0=1).

An LDPC decoder and a transmitting/receiving device thereof according to the above-described example embodiments transmit data with a packet extension PE, the length of which is set to correspond to a pre-FEC padding factor a to perform decoding without being influenced by a decoding latency while satisfying the SIFS condition according to the 801.11ax standard. A maximum iteration number can be adjusted adaptively according to a state of data received by a receiving device to reduce power consumption while greatly increasing an operating speed. In addition, in example embodiments of a receiving device with a plurality of LDPC decoders, the number of decoders to be enabled can be controlled according to a state of received data to improve PER performance while allowing the LDPC decoders to be used more efficiently.

The terms "transmit," "receive," and "communicate" and derivatives thereof may be used to describe both direct communication and indirect communication. Terms such as "comprise" and "include" and derivatives thereof may be used to describe inclusive inclusion. The term "and" and "or" should be understood to include "and/or." The expression "at least one" should be understood to include one or more different combinations of listed items, when used with a list of the items, and to mean that only one of the items of the list may be necessary. For example, "at least one of A, B, and C" includes A, B, C, A and B, A and C, B and C, or any combination of A, B and C.

In addition, the various functions described above are implementable or supportable by one or more computer programs and each of the programs may include computer-readable program code and be executed through a computer-readable medium.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FGPA), a System-on-Chip (SoC), a programmable logic unit, a microprocessor, application-specific integrated circuit (ASIC), etc.

The terms "application" and "program" refer to one or more computer programs, software components, sets of instructions, procedures, functions, objects, classes, instances, related data, or parts thereof sufficient to execute appropriate computer-readable program code. The expression "computer-readable program code" refers to various types of computer code, including source code, object code, and execution code. The expression "computer-readable medium" includes various types of media accessible by a computer, such as a read-only memory (ROM), a random access memory (RAM), a hard disk drive, a compact disc (CD), a digital video disc (DVD), or other types of memory. "Non-transitory" computer-readable media exclude wired, wireless, optical, or other communication links for transmission of transitory electric or other signals. Non-transitory computer-readable media include media in which data can be permanently stored, and media in which data can be stored and overwritten, e.g., a rewritable optical disc or an erasable memory device.

The various example embodiments of the present disclosure set forth herein have been described with respect to a hardware access method as an example. However, various example embodiments of the present disclosure include technology using both hardware and software and thus do not exclude software-based access methods.

As used herein, the terms used to describe control information, entry, network entities, messages, components of a device, etc. are provided as examples only for convenience of description. Accordingly, the present disclosure is not limited to the terms described above and other terms having equivalent technical meanings may be used herein.

Although example embodiments of the present disclosure have been described above with reference to the appended drawings, it will be understood by those of ordinary skill in the technical field to which the present disclosure pertains that the present disclosure is implementable in many different forms without departing from the technical scope and essential features thereof. Therefore, it should be understood that the example embodiments described above are provided to give examples in all aspects and not for purposes of limitation.

What is claimed is:

1. A receiving device comprising:
a demapper configured to convert received data into a log likelihood ratio (LLR) signal and output the LLR signal;
a deparser configured to rearrange the LLR signal by deparsing the LLR signal into orthogonal frequency division multiplex (OFDM) symbols;
a codeword loader configured to output the rearranged LLR signal in units of codewords;
a decoder controller configured to control a maximum iteration number and the number of decoders to be enabled according to a state of the received data, the maximum iteration number being based on a symbol duration according to the state of the received data; and
a low-density parity check (LDPC) decoder configured to repeatedly decode the LLR signal in units of codewords, according to the controlled number of decoders, as many times as the controlled maximum iteration number,
wherein the received data comprises real data and a packet extension corresponding to a pre-FEC (forward error correction) padding factor,
wherein the decoder controller comprises:

a short interframe space (SIFS) iteration number calculation module configured to calculate a maximum number of SIFS iterations according to the state of the received data;

a symbol duration iteration number calculation module configured to calculate the maximum iteration number per the symbol duration according to the state of the received data; and a multiplexer configured to output the maximum number of SIFS iterations based on a current symbol to be decoded being a last symbol and output the maximum iteration number per symbol duration as a final maximum iteration number based on a current symbol to be decoded not being a last symbol.

2. The receiving device of claim 1, wherein the SIFS iteration number calculation module is configured to output a first decoder enable signal according to a result of comparing a minimum number of iterations and the maximum number of SIFS iterations the symbol duration iteration number calculation module is configured to output a second decoder enable signal according to a result of comparing the minimum number of iterations and the maximum iteration number per symbol duration, and the LDPC decoder is configured to enable at least one of a plurality of LDPC decoders in response to the first decoder enable signal or the second decoder enable signal according to whether a current symbol is a last symbol.

3. The receiving device of claim 2, wherein the decoder controller comprises an active decoder controller configured to select and output the first decoder enable signal or the second decoder enable signal according to whether a current OFDM symbol to be decoded is a last OFDM symbol.

4. The receiving device of claim 3, wherein the active decoder controller comprises an OR circuit configured to perform an OR operation on the first decoder enable signal and the second decoder enable signal and output a result of the OR operation.

5. The receiving device of claim 1, wherein the SIFS iteration number calculation module is further configured to:

calculate a maximum number of codewords of a last symbol on the basis of a bandwidth, a modulation coding scheme, the number of spatial streams, the pre-FEC padding factor, and a packet type;

calculate a total number of decoding cycles according to the maximum number of codewords and the number of decoders to be activated; and calculate the maximum number of SIFS iterations on the basis of the total number of decoding cycles, pre-decoding cycles, media access control (MAC) cycles, a packet extension duration, an SIFS condition, and a frequency.

6. The receiving device of claim 5, wherein the calculating of the maximum number of SIFS iterations comprises adjusting the number of decoders to be enabled to set the maximum number of SIFS iterations to be greater than a minimum number of iterations.

7. The receiving device of claim 5, wherein the calculating of the maximum number of SIFS iterations comprises:

multiplying the number of 100% decoding cycles by the number of decoders to be enabled, the number of the 100% decoding cycles being calculated by subtracting the pre-decoding cycles and the MAC cycles from an SIFS duration according to the packet extension duration, the frequency, and the SIFS condition; and setting, as the maximum number of SIFS iterations, a value smaller than a value obtained dividing a result of the multiplication by the sum of the maximum number of codewords and the number of decoding cycles per iteration.

8. The receiving device of claim 1, wherein the symbol duration iteration number calculation module is further configured to:

calculate a maximum number of codewords of a last symbol on the basis of a bandwidth, a modulation coding scheme, the number of spatial streams, the pre-FEC padding factor, and a packet type;

calculate a total number of decoding cycles from the maximum number of codewords and the number of decoders to be activated; and calculate the maximum iteration number per symbol duration on the basis of the total number of decoding cycles, an OFDM symbol duration, and a frequency.

9. The receiving device of claim 8, wherein the calculating of the maximum iteration number per symbol duration comprises adjusting the number of decoders to be enabled to set the maximum iteration number per symbol duration to be greater than a minimum number of iterations.

10. The receiving device of claim 8, wherein the calculating of the maximum iteration number per symbol duration comprises:

multiplying the number of decoding cycles according to the OFDM symbol duration and the frequency by the number of decoders to be enabled; and setting, as the maximum iteration number per symbol duration, a value smaller than a value obtained by dividing a result of the multiplication by the sum of the maximum number of codewords and the number of decoding cycles per iteration.

11. The receiving device of claim 1, wherein the state of the received data comprises a maximum number of MAC iterations, a bandwidth, a modulation coding scheme, the number of spatial streams, a minimum number of iterations, the pre-FEC padding factor, an OFDM symbol duration, a frequency, a packet type, and/or a packet extension duration.

12. The receiving device of claim 11, wherein the LDPC decoder is configured to perform decoding on the basis of a point in time when receiving of the real data is completed, and the receiving device is configured to transmit an acknowledgement message to a transmitting device after a SIFS duration as of a point in time when receiving of the packet extension duration is completed.

13. A decoding system comprising:

a decoder controller configured to control a maximum iteration number and the number of decoders to be enabled according to a state of received data; and a low-density parity check (LDPC) decoder including a plurality of LDPC decoders and configured to repeatedly decode a codeword of a received current OFDM symbol according to the controlled number of decoders, until the controlled maximum iteration number is reached, wherein the received data comprises real data and a packet extension, wherein the decoder controller comprises:

a short interframe space (SIFS) iteration number calculation module configured to calculate a maximum number of SIFS iterations according to the state of the received data when a current symbol is a last symbol; and a symbol duration iteration number calculation module configured to calculate the maximum iteration number per the symbol duration according to the state of the received data based on the current symbol not being a last symbol, wherein the maximum number of SIFS iterations or the maximum iteration number per symbol duration is output as the controlled maximum iteration number according to whether the current symbol is a last symbol.

14. The decoding system claim 13, wherein the state of the received data further comprises a maximum number of media access control iterations, a bandwidth, a modulation coding scheme, the number of spatial streams, a minimum number of iterations, a pre-FEC padding factor, a frequency, a packet type, and/or a packet extension duration.

15. The decoding system of claim 13, wherein the decoder controller is configured to compare the maximum number of SIFS iterations or the maximum iteration number per symbol duration with a maximum iteration number, and is configured to output the smaller value as the controlled maximum iteration number.

* * * * *